United States Patent [19]

Minami

[11] Patent Number: 4,949,157
[45] Date of Patent: Aug. 14, 1990

[54] LARGE SCALE INTEGRATED CIRCUIT
[75] Inventor: Eiichi Minami, Hadano, Japan
[73] Assignee: Hitachi, Ltd., Tokyo, Japan
[21] Appl. No.: 253,186
[22] Filed: Oct. 4, 1988
[30] Foreign Application Priority Data Oct. 6, 1987 [JP] Japan .................... 62-251963

[51] Int. Cl.⁵ .......................................... H01L 23/48
[52] U.S. Cl. ........................................ 357/68; 357/40;
357/45; 357/71
[58] Field of Search .................... 357/40, 45, 68, 71
[56] References Cited

U.S. PATENT DOCUMENTS 4,746,965   5/1988   Nishi ........................... 357/68
4,816,887   3/1989   Sato ............................ 357/45
4,825,276   4/1989   Kobayashi ................... 357/71

OTHER PUBLICATIONS

Nikkei Microdevices, pp. 111–126, Jul. 1986, by Nikkei McGraw-Hill Co.

Primary Examiner—Andrew J. James
Assistant Examiner—Mark Prenty
Attorney, Agent, or Firm—Antonelli, Terry, Stout & Kraus

[57] ABSTRACT

This invention relates to an LSI in which a gate electrode wiring in a logic cell which is constructed by combining a plurality of basic cells each of which consisting of a pair of p-type and n-type MOS transistors and a gate electrode wiring, has portion extending substantially to a marginal region which does not contain logic cells. Additionally wiring portions associated with the LSI are disposed in a layer different from the layer to which the extended portions of the gate electrode wiring belongs. The extended portions, in the marginal region, are connectible portions through through holes. Such a structural arrangement results in an increase in the gate utilization ratio and improves the reliability of an LSI without decreasing the freedom to lead the wiring between gates.

6 Claims, 4 Drawing Sheets

LARGE SCALE INTEGRATED CIRCUIT

BACKGROUND OF THE INVENTION

This invention relates to a large scale integrated circuit (hereinbelow abbreviated to LSI) and, in particular, to a gate array type LSI.

Among design techniques for LSIs, as those classified to semi-custom LSIs, there are known those of gate array type and those of standard cell type.

As an example of publications, where gate array type LSIs are described, there is e.g. "NIKKEI MICRODEVICES" published by Nikkei McGraw Publishing Co., July 1986, p. 111–p. 126.

Fabrication processes of LSIs are divided usually into two processes, i.e. diffusion process and wiring process, and for the gate array type LSIs they are characterized in that the diffusion process remains unchanged (in common), independently of the kind of products, but only the wiring process varies, depending thereon. That is, the diffusion process is common for all kinds of products and is effected so that a plurality of basic cells are arranged in a regular pattern both in the longitudinal and in the transversal direction. On the other hand, the wiring process varies, depending on the kind of products being implemented, and various kinds of wiring are performed, according to user specifications, so as to obtain various kinds of logic LSIs. On the contrary the standard cell type LSIs are fabricated by various independent processes from the step of the diffusion process on the surface of elements.

As stated above, the gate array type has an advantage that the duration of development thereof is shorter than that of the standard cell type, because a part of the fabrication processes is common.

The prior art gate array type LSI will be explained further, referring to FIGS. 3 to 10.

FIG. 3 is a scheme illustrating the construction of a prior art LSI according to the gate array type; FIG. 4 is a scheme showing it more specifically; FIG. 5 is a scheme for explaining an example of the construction of a prior art multilayered wiring; FIG. 6 is a symbolized scheme of a two-input NAND gate; FIG. 7 is an equivalent circuit diagram of the NAND gate indicated in FIG. 6; FIG. 8 illustrates the layout in the case where the NAND gate indicated in FIG. 6 is realized in an element; FIG. 9 is a cross-sectional view of the gate stated above; and FIG. 10 shows an example of the construction of a multilayered wiring according to a prior art technique.

In FIG. 3, reference numeral 1 is a semiconductor substrate; 2 is a basic cell consisting of a pair including a p-type MOS transistor 2a and an n-type MOS transistor 2b; 4 is a certain logic cell composed of basic cells 2; and the region indicated by 5 is a marginal region. In this marginal region 5, the line indicated by a full line 6 in the horizontal direction in the figure is a first layer metal wiring and on the other hand the lines indicated by broken lines 7 belong to a second layer metal wiring. The first layer metal wiring is connected with the second layer metal wiring by interlayer connection through through holes 8.

FIG. 4 illustrates more concretely such a gate array type LSI.

In FIG. 4, in the basic cell 2 described above, a gate electrode wiring 10, which is not shown in FIG. 3, is formed in the vertical direction in the figure between the p-type MOS transistor 2a and the n-type MOS transistor 2b. On the extension of this gate electrode wiring 10 there is formed the marginal region. 5, which has been explained in connection with FIG. 3. A logic cell 4 such as an inverter, a flipflop, etc. can be constructed by one or by combining suitably a plurality of basic cells 2. In order to construct such a logic cell 4, the gate electrode wiring 10 of the basic cell 2, the first and second metal wirings 6, 7 and a through hole 8 are used. Here the through hole 8 is used for connecting the metal wirings belonging to different layers with each other or for connecting electrically the first metal wiring 6 with the p type MOS transistor 2a or the n-type MOS transistor 2b.

FIG. 5 illustrating an example of the construction of a multilayered wiring shows the relation between the construction of wiring paths belonging to different layers and a lattice, which a DA (Design Automation) program can deal with, (hereinbelow called DA lattice). In FIG. 5 the abscissa X indicates the DA lattice point of the wiring perpendicular to the row of the basic cell 2 and the ordinate Y indicates the DA lattice point of the wiring parallel to the row of the basic cell 2, m and n in the coordinates X and Y, respectively, being arbitrary integers.

In FIG. 5 wiring paths 14 indicated by full lines in the vertical direction are wiring paths destined for the gate electrode wiring of the p-type MOS transistor 2a and the n-type MOS transistor 2b, which paths are disposed with a 2-DA lattice interval.

On the other hand wiring paths 15 indicated by full lines in the horizontal direction are wiring paths destined for the first layer metal wiring 6, which paths are disposed with a 1-DA lattice interval in the direction parallel to the row of basic cells.

Further wiring paths 16 indicated by broken lines extending in the vertical direction are wiring paths destined for the second layer metal wiring 7, which paths are disposed parallelly to the wiring paths 14 with a 2-DA lattice interval at positions shifted therefrom by a 1-DA lattice interval.

That is, at the circuit design on the LSI it is possible to realize a desired circuit pattern by using selectively the wiring paths 14, 15 and 16 prepared in advance.

Now the cross-sectional construction of the LSI described above will be briefly explained below. The p-type MOS transistors 2a and n-type MOS transistors 2b are formed in the upper surface portion of the semiconductor substrate 1 by the diffusion process. At first the first layer metal wiring 6 is formed thereon through an insulating layer not shown in the figure. The final product is so constructed that the second layer metal wiring 7 is formed further thereon through another insulating layer.

Hereinbelow the constructional example of the logic cell formed by the basic cell 2 and the metal wirings 6 and 7 will be specifically explained.

The NAND gate as indicated in FIG. 6 is realized in general according to the equivalent circuit indicated in FIG. 7. In FIG. 7, reference numeral 18 is a power source wiring $V_{DD}$ and 19 is an earth (ground) wiring.

FIG. 8 shows the realization of the equivalent circuit indicated in FIG. 7 by laying out basic cells 2 on the semiconductor substrate.

That is, in FIG. 8, gate electrode wiring 10 on the p-type MOS transistor 2a and the n-type MOS transistor 2b constitutes input terminals A and B and there are disposed the power source wiring 18 and the earth wiring 19 in the direction perpendicular to the gate electrode wiring 10 thereon through an insulating layer.

The inner parts of p-type MOS transistors 2a within the basic cell 2 stated above are connected with each other or with n-type MOS transistors by the first layer metal wiring 6 through the through holes 8. In this way the circuit construction indicated in FIG. 7 is realized.

Further the whole circuit is so constructed that basic cells 2 are separated from each other by isolations 20, as indicated in FIG. 9.

Recently logic cells having a large gate scale have been used more and more often, based on a requirement that a combination of certain logics stored beforehand as a library is used in order to reduce the number of steps in the logic design or on a requirement due to development of automatic design programs, etc.

In the case where such a large scale logic cell is constructed in the gate array type stated above, the internal wirings of the logic cell 4 alone are not enough for the wiring. For this reason, the lead out of wiring from the basic cell 2 could not help but become realized by using necessarily a part of the first layer metal wiring 6 on the marginal region 5, as indicated in FIG. 4.

At this time the second layer metal wiring 7 is used as extension of the wiring in the vertical direction in the figure in order to connect the gate electrode wiring 10 of the basic cell 2 with the first layer metal wiring 6 stated above, as indicated in FIG. 4. As the result, the second layer metal wiring 7 is necessarily used more often, as the gate scale becomes greater.

If the second layer metal wiring 7 is used often for the internal wiring in the logic cell 4, as indicated in FIG. 10, at leading of the wiring between gates only passing on the basic cell 2, the wiring should be disposed, diverted from the portion, where the internal wiring is disposed. As the result, freedom to lead the wiring between gates is reduced.

In this way, if freedom to lead the wiring between gates is reduced, there remain a number of lines between different logic cells, which are not wired, even after execution of an automatic wiring program. Therefore, according to circumstances there was a possibility that additional wiring was difficult even manually. As a result, in a gate array type semiconductor device, such as that according to prior efforts, the gate utilization ratio is reduced and as a result thereof the functions and performance thereof as a semiconductor element become lowered.

Further, as it is clearly seen from FIG. 4, through holes 8 are often used in order to make the second layer metal wiring 7 pass therethrough as extension of wiring to the marginal region 5, which results in complication of the fabrication steps.

In developing the present invention, the inventor considered fully the problems described above and the object thereof of providing a LSI capable of increasing the gate utilization ratio in a gate array type LSI and which has a high reliability.

SUMMARY OF THE INVENTION

At first the outline of a representative feature of the invention disclosed in this specification will be explained briefly, as follows.

That is, this invention relates to an LSI in which the end portions of the gate electrode wiring constituting the basic cell are extended to the marginal region and the extended portions are connected with wiring disposed in the marginal region through through-holes.

By using the means described above, owing to the construction, in which the end portions of the gate electrode wiring are extended to the marginal region in the basic cell, it is not necessary to use metal wiring on the basic cell region too often for performing the internal wiring of a logic cell and thus, even if the scale of logics is complicated, freedom to lead the wiring between gates is not reduced. Therefore, the gate utilization ratio of semiconductor elements is increased, which results in the improvement of the reliability of the LSI.

DESCRIPTION OF THE PREFERRED EMBODIMENTS

Figure 1:
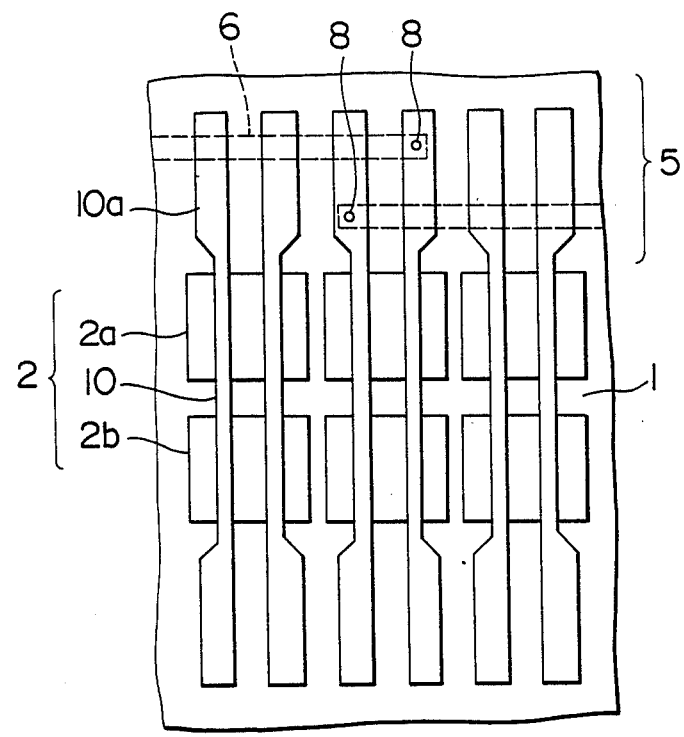
FIG. 1 is a scheme for explaining the construction of an LSI formed on a semiconductor element, which is an embodiment of this invention.
Figure 2:
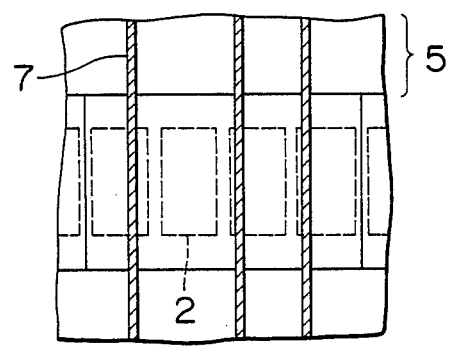
FIG. 2 is a scheme for explaining an example of the structure of a multilayered wiring in the embodiment indicated in FIG. 1.
Figure 3:
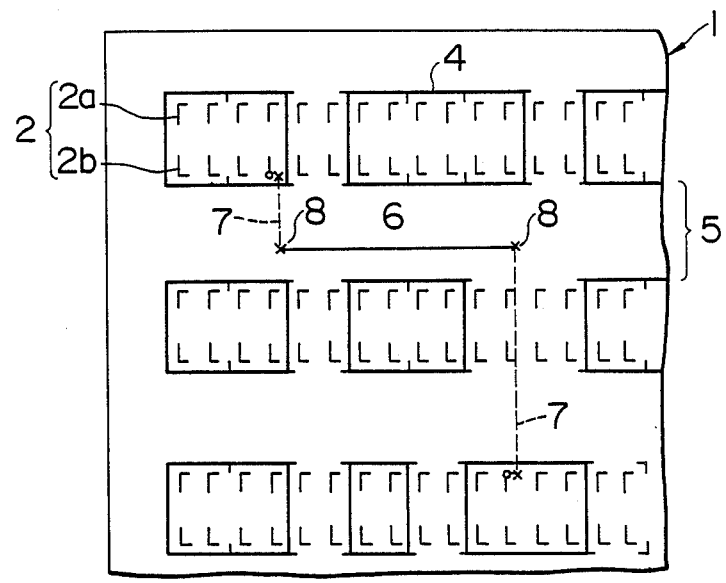
FIG. 3 is a scheme for explaining the outline of an gate array type semiconductor LSI according to prior art techniques.

FIG. 1 is a scheme for explaining the construction of an LSI formed on a semiconductor element, which is an embodiment of this invention and FIG. 2 is a scheme for explaining an example of the structure of a multilayered wiring in the embodiment indicated in FIG. 1.

The LSI in this embodiment, is a so-called gate array type circuit, which can realize predetermined logic functions by performing selectively and suitably wiring between gates, using one or several basic cells.

In FIG. 1 reference numeral 1 is a semiconductor substrate; 2a is a p-type MOS transistor; 2b is an n-type MOS transistor; 5 is a marginal region; 6 is a first layer metal wiring; 8 is a through hole and 10 is a gate electrode wiring. The construction of these parts is almost identical to those indicated in FIG. 4 according to prior art techniques. However, in this embodiment indicated in FIG. 1, the circuit is so constructed that the end portions of the gate electrode wiring 10 are extended to the marginal region 5 and that these extended portions 10a are connected directly with the first layer metal wiring through through holes 8. Such an extended portion 10a of the gate electrode wiring 10 can be easily formed by slightly modifying the mask used for forming the gate electrode wiring 10.

Figure 4:
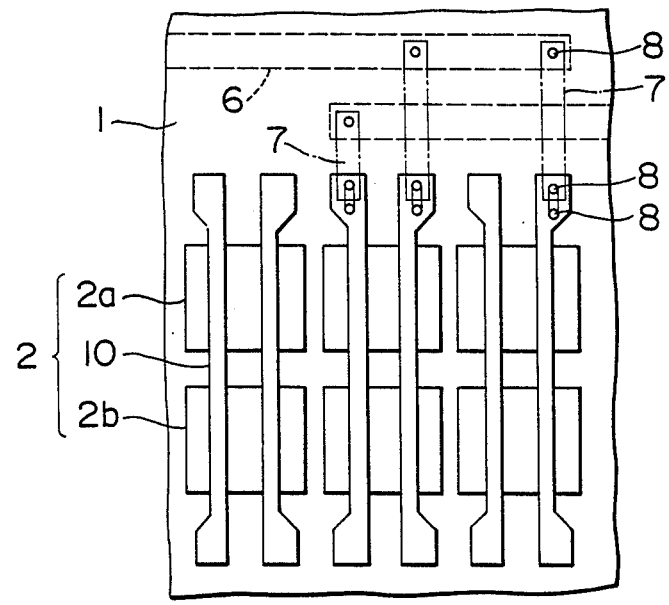
FIG. 4 is a scheme for explaining the construction of a prior art LSI.
Figure 5:
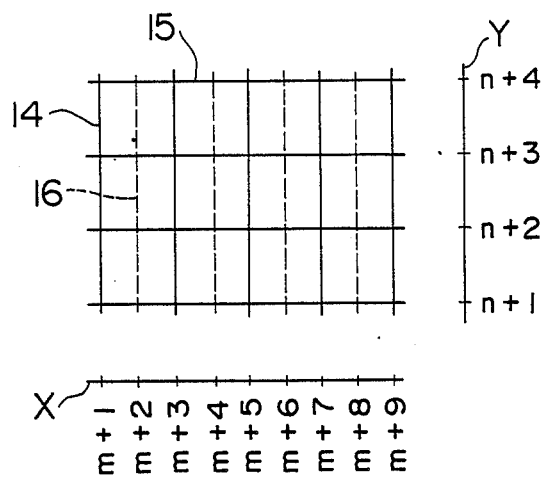
FIG. 5 is a scheme for explaining an example of the construction of a prior art multilayered wiring.
Figure 6:
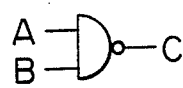
FIG. 6 is a symbolized scheme of a two-input NAND gate.
Figure 7:
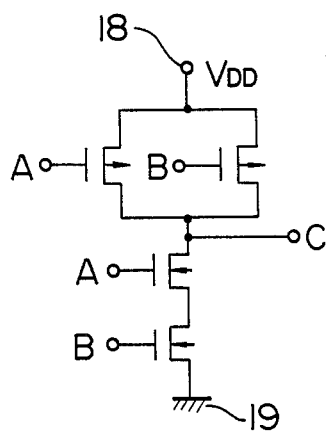
FIG. 7 is an equivalent circuit diagram of the NAND gate indicated in FIG. 6.
Figure 8:
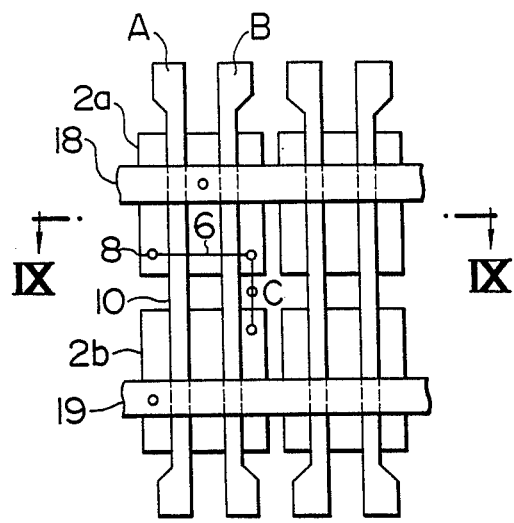
FIG. 8 illustrates the layout in the case where the NAND gate indicated in FIG. 6 is realized in an element.
Figure 9:
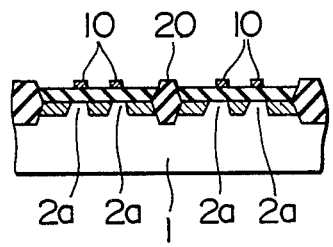
FIG. 9 is a cross-sectional view of the gate indicated in FIG. 8.

In this way, in this embodiment, since the gate electrode wiring 10 is so constructed that the end portions thereof are extended to the marginal region by the extended portions 10a, also in the case where the first layer metal wiring 6 is used as a part of the internal wiring of the logic cell 4, it is not necessary to use the second layer metal wiring 7 as indicated in FIG. 4.

Figure 10:
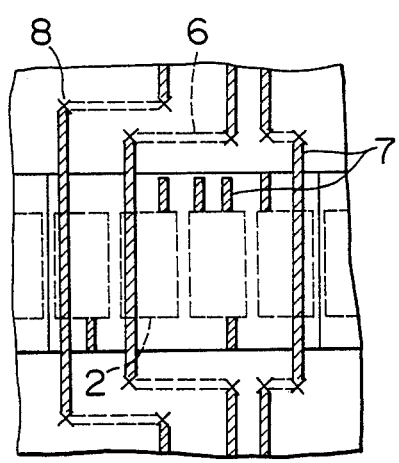
FIG. 10 is a scheme for explaining an example of the construction of a multilayered wiring according to a prior art technique.

For this reason, it is possible to keep the second layer metal wiring 7 of the basic cell 2 in an unused state and thus to assign a large or significant part of the second layer metal wiring, which is in an unused state, to the wiring between gates. With respect to this, in FIG. 10 which shows a prior art example, the second layer metal wiring 7 was widely used and thus leading of the wiring between gates passing on the basic cell 2 was complicated.

In the contrary, according to this embodiment, since a large part of the second layer metal wiring, which is in an unused state, can be used for the wiring between gates, it is possible to make the wiring between gates pass on (above or over) the basic cell without difficulty. In this way freedom to lead the wiring between gates is significantly increased and in the whole semiconductor device the gate utilization ratio is improved.

In this way, according to this invention, the following effects can be obtained:

(1) Freedom to lead the wiring between gates is increased, because it is possible to assign a large part of the second layer metal wiring 7, which is not used, to that part of the wiring passing on (over or above) the basic cell 2, owing to the fact that the end portions of the gate electrode wiring 10 are extended to the marginal region 5 and the internal wiring of the logic cell 4 is performed by connecting these extended portions 10a directly with the first layer metal wiring 6 disposed in the marginal region 5 through through holes 8.

(2) Owing to (1) stated above, it is possible to increase the gate utilization ratio in an LSI and to realize a high degree of integration of the LSI.

(3) Since the number of through holes 8 is reduced owing to (1) stated above, processing of the LSI is made easier and thus it is possible to increase the fabrication efficiency of the LSI.

(4) Since the number of connections in the wiring is reduced, it is possible to improve electric characteristics of the LSI and thus to provide an LSI having a high working reliability.

Although this invention has been explained in the above on the basis of preferred embodiments, this invention is not restricted to the embodiments described above. Furthermore, as a matter of course that various modifications are possible that are within the scope without departing from the spirit of the invention. For example, although explanation has been made for the case where two sorts of wiring layers, i.e. the first layer metal wiring 6 and the second layer metal wiring 7, are used, this invention is valid also for a construction including more than two wiring layers.

The effects obtained by the representative invention disclosed in this specification can be explained briefly as follows:

That is, it is possible to increase the gate utilization ratio of the semiconductor element and as the result to improve the reliability of the LSI, even in the case where the logic scale is complicated. This improvement result since it becomes unnecessary to use often metal wiring which is on (above) the basic cell region, because the LSI is provided with a type of construction in which the end portions of the gate electrode wiring of the basic cell are extended to the marginal region and the extended portions are connected with the wiring disposed on the marginal region through through holes.

I claim:

1. A large scale integrated circuit constructed in a gate array type, having basic cells, comprising:
    a semiconductor substrate having a main surface region;
    logic cells, each of which is constructed by combining a plurality of said basic cells including at least a gate electrode wiring and being disposed on the main surface region of said semiconductor substrate;
    a marginal region on the main surface region of said semiconductor substrate which does not include said logic cells;
    wherein said gate electrode wiring includes extended portions which extend to said marginal region;
    at least one wiring which includes wiring portions being disposed in said marginal region and in a layer which is different from the layer to which said extended portions of said gate electrode wiring belong;
    said extended portions of said gate electrode wiring intersecting, in said marginal region, with more than one of said wiring portions corresponding to said at least one wiring and which portions which extend in a different direction from that of said gate electrode wiring; and
    through holes, through which said extended portions of said gate electrode wiring are connected with said wiring portions of the layer which is different therefrom.

2. A large scale integrated circuit according to claim 1, wherein said wiring portions are disposed in two or more layers different from the layer to which said extended portions of said gate wiring belong.

3. A large scale integrated circuit according to claim 1, wherein said extended portions of said gate electrode wiring are wider than that part of said gate electrode wiring which is on said basic cells.

4. A large scale integrated circuit constructed in a gate array of the type having basic cells which include pair arrangements of complementary channel MOS transistors, comprising:
    a semiconductor substrate having a main surface region wherein said circuit is implemented;
    logic cells, each of which being constructed by combining a plurality of said basic cells, wherein each basic cell is disposed on said main surface region and includes at least one pair of said complementary channel MOS transistors and corresponding gate electrode wiring, and wherein said gate electrode wiring, corresponding to each basic cell, includes a first portion which is insulatedly disposed directly above the corresponding basic cell and a second portion which is contiguous with the corresponding first portion;
    a marginal region on the main surface region of said semiconductor substrate which does not include said logic cells;
    wherein the second portion of said gate electrode wiring corresponding to each basic cell includes at least a pair of extended portions on opposite sides of the corresponding first portion thereof, said extended portions being extended to said marginal region;
    at least one wiring which includes portions which are disposed in said marginal region, said one wiring corresponding to a wiring layer which is a relatively different level layer from the corresponding layer to which said extended portions of said gate electrode wiring belong;

wherein the extended portions of each said gate terminal wiring intersect, in said marginal region, with more than one of said wiring portions corresponding to said at least one wiring and which wiring portions extend in a different direction from that of said gate electrode wiring and along the plane of said semiconductor substrate; and through holes, formed above said marginal region, which electrically connect the extended portions of said gate electrode wiring with the wiring portions corresponding to a different level wiring layer corresponding to said at least one wiring.

5. A large scale integrated circuit according to claim 4, wherein said wiring portions are disposed in two or more layers different from the layer to which said extended portions of said gate wiring belong.

6. A large scale integrated circuit according to claim 5, wherein each extended portion corresponding to said second portion of each gate electrode wiring has a width which is substantially greater than the wiring width corresponding to said first portion thereof.

* * * * *